United States Patent [19]

Shiozawa

[11] Patent Number: 5,661,676
[45] Date of Patent: Aug. 26, 1997

[54] SEMICONDUCTOR MEMORY AND METHOD OF FABRICATING THE SAME

[75] Inventor: Yasutaka Shiozawa, Tokyo, Japan

[73] Assignee: NEC Corporation, Tokyo, Japan

[21] Appl. No.: 560,689

[22] Filed: Nov. 20, 1995

[30] Foreign Application Priority Data

Nov. 22, 1994 [JP] Japan ................... 6-287739

[51] Int. Cl.$^6$ .................................................. G11C 5/06
[52] U.S. Cl. ...................... 365/63; 365/51; 365/230.03
[58] Field of Search .................... 365/63, 51, 230.3, 365/230.01

[56] References Cited

U.S. PATENT DOCUMENTS 5,463,577  10/1995  Oowaki et al. .................... 365/63

FOREIGN PATENT DOCUMENTS 63-48182  2/1988  Japan .

*Primary Examiner*—David C. Nelms
*Assistant Examiner*—F. Niranjan
*Attorney, Agent, or Firm*—Sughrue, Mion, Zinn, Macpeak & Seas

[57] ABSTRACT

The invention provides a semiconductor memory including an address decoder, a first word line in electrical connection with an output terminal of the address decoder, a plurality of second word lines, a plurality of memory cells in electrical connection in parallel with each of the second word lines, a plurality of contacts each of which electrically connects each of the second word line to the first word line, and a compensator for signal delay among the memory cells in each of the second word lines. In accordance with the semiconductor memory, a group of the second word lines are connected to the first word line through a contact. Thus, since it is impossible for a memory cell in connection with the first word line through a defective contact to carry out writing data therein and reading data therefrom, such a memory cell can be readily, electrically found for removal.

17 Claims, 4 Drawing Sheets

SEMICONDUCTOR MEMORY AND METHOD OF FABRICATING THE SAME

BACKGROUND OF THE INVENTION

1. Field of the Invention

The invention relates to a semiconductor memory and a method of fabricating the same. More particularly, the invention relates to an improvement for signal delay which occurs in a word line.

2. Description of the Related Art

In operation of a semiconductor memory, an address signal is decoded by a column address decoder to thereby select a certain word line, and a certain bit line is selected by a row address decoder. Then, through an input/output control circuit, data is written into or read from a memory cell disposed at an intersection of the thus selected word and bit lines. The data read out from a memory cell is amplified by a sense amplifier, and then output through the input/output control circuit.

The above mentioned word line is composed of relatively highly resistive material such as polysilicon of which a transistor gate is in general composed. In order to operate a semiconductor memory at higher speed and stably amplify bit line signals by means of a sense amplifier, it is necessary to minimize signal delay in a word line caused by wire resistance.

One of solutions to such signal delay is to form a second word line in parallel with a word line. The second word line is composed of material having a small wire resistance such as aluminum. The second word line is arranged to be in electrical connection with the word line through contacts, and a gate electrode is composed of highly resistive conductor such as polysilicon, thereby lowering a time constant of delay speed of signals to be transmitted to the word line.

For instance, in a high capacitance memory such as 16M DRAM and 64M DRAM, the number of transistor gates included in memory cells to be selected by a single word line reaches 4000 or 8000 or more. Hence, a word line cannot avoid to be lengthened. Thus, if a word line is composed of highly resistive material, signal delay in a word line is facilitated and accordingly it is impossible to operate a semiconductor memory at higher speed. In view of such a problem, an attempt has been made to carry out high-speed operation of a semiconductor memory by backing a word line with a second word line having a relatively low resistance to thereby lower a time constant of a word line with respect to transmission of drive signals.

In such an attempt, it is necessary to connect a word line with a second word line or a backing line. In a semiconductor memory, a connection called a contact is in general used. In a high capacitance semiconductor memory, a contact has to be minimized in size for minimizing an area of a chip. Accordingly, if fine dust is adhered to a surface of a semiconductor memory during a semiconductor memory fabrication process, a contact hole may be opened insufficiently. As a result, a word line is in insufficient connection with a second word line. As an alternative, even if a word line comes to connection with a second word line, such a connection is only through a hole resistance.

An example of the above mentioned second word line is described in Japanese Unexamined Patent Public Disclosure No. 63-48182. FIGS. 1A and 1B are cross-sectional views illustrating the second word line disclosed in No. 63-48182. FIG. 1A shows a positional relationship among a memory cell transistor, a word line and a second line as a backing line, and FIG. 1B shows that the word line is in connection with the second word line through a first aluminum wiring. As illustrated, on a P-type silicon substrate 301 is formed a memory circuit consisting of a polysilicon film and two aluminum wiring layers. The polysilicon film is patterned to form word lines 306, and a gate electrode and a capacity plate 305 of a transistor. A bit line is composed of a first aluminum wiring layer 309, and is in connection with a memory cell through an opening leading to a source/drain diffusion layer. A second aluminum wiring layers 311 are low resistive layers and serve as a backing layer for the word lines 306 composed of polysilicon. The second aluminum wiring layers 311 is in electrical connection with the first aluminum wiring 309, which is in connection with the word lines 306, through an opening.

The word lines 306 and the capacity plate 305 are covered with a first interlayer insulative film 308, and the bit line 309 composed of the first aluminum wiring layer extends over the first interlayer insulative film 308, and is connected to a source/drain region 307 composed of an $n^+$ diffusion layer. Over the bit line 309 is deposited a second interlayer insulative film 310, on which extend the second aluminum wiring layers 311.

Through the first aluminum wirings 309, each of the word lines 306 are in electrical connection with each of the second aluminum wirings 311 serving as a low resistive backing wiring.

With reference to FIG. 2 illustrating a relationship among the word line, the backing wiring, and a plurality of memory cells of a semiconductor memory. A group of memory cells including a memory cell 204a are in electrical connection with a word line 201a composed of the first aluminum wirings 309. Over the word line 201a are arranged a group of backing wirings including a backing wiring 202a made of polysilicon and serving as a second wiring layer. Each of the backing wirings is in connection with an output terminal of a column decoder. As illustrated, the backing wiring 202a is in connection with an output terminal of a column decoder 205. The group of the backing wirings are in electrical connection with the group of the word lines through contacts at desired points. For instance, as illustrated in FIG. 2, the backing wiring 202a is in electrical connection with the word line 201a through a plurality of contacts (only 203a and 203b are illustrated).

In operation, for instance, when the content of the memory cell 204a is to be read out, the relatively low resistive backing wiring 202a is selected by the decoder 205, and then a word line drive signal φ2w is activated and transmitted to the backing wiring 202a. The word line drive signal φ2w is then transmitted to the relatively high resistive word line 201a through the contact 203a to thereby activate a gate of fie memory cell transistor 204a. The content of the memory cell 204a is read out and output onto a bit line selected by a row decoder (not illustrated), and then amplified by a sense amplifier.

The wire resistance of the word line 201a is in general about 10 to 100 times greater than the wire resistance of the backing wiring 202a. Hence, word-driving at higher speed is dependent on how frequently the contacts 203a, 203b,—are formed relative to the word line 201a and the backing wiring 202a. In the semiconductor memory illustrated in FIG. 2, a contact is arranged to drive six memory cells, namely, three by three at opposite ends thereof.

In the conventional semiconductor memory illustrated in FIGS. 1A, 1B and 2, if the contact 203a is broken for some reason and thus cannot transmit a signal therethrough, the activation of the memory cell 204a is carried out by a signal transmitted through the contact 203b. However, comparing the transmission speed of a signal transmitted through the contact 203b with the transmission speed of a signal transmitted through the contact 203a which is a proper route for transmitting a signal therethrough, the transmission speed through the contact 203b is made decreased due to the wire resistance and parasitic capacitance combined in a detour, that is, a difference in distance between a route from the decoder 205 to the memory cell 204a through the contact 203b and a route from the decoder 205 to the memory cell 204a through the contact 203a. The decreased transmission speed of a signal retards the activation of the memory cell 204a. In other words, a period of time from the activation of the word line drive signal φ2w to the activation of the memory cell 204a is made longer relative to an intended period of time due to the wire resistance of the parasitic capacitance of the word line 201a.

It is possible to design a semiconductor memory, which is intended to operate at higher speed, so that even if the contact defectiveness as mentioned above occurs, a bit line can be properly sense-amplified under certain conditions. Namely, a period of time from the activation of a word line drive signal φ2w to the commencement of sense-amplification of a bit line can be designed to be longer so as to compensate for the signal transmission delay in the word line which would be caused by the contact defectiveness. However, a semiconductor memory has to properly operate at ambient temperature ranging from 0 to 70 degrees centigrade. Polysilicon has the property that it comes to have higher wire resistance in lower temperature. Thus, in low ambient temperature, the transmission speed of a signal detoured through the contact 203b is further reduced, and accordingly the activation of the memory cell 204a is further retarded.

It is necessary to remove semiconductor memories having the contact defectiveness, even if such semiconductor memories electrically, properly operate at room temperature. For removal of such semiconductor memories, sorting memories with respect to electrical properties is most efficient and indispensable.

SUMMARY OF THE INVENTION

It is an object of the present invention to provide only a reliable semiconductor memory by electrically sorting at room temperature and removing memories including a defective contact which connects a word line having a relatively high wire resistance to a backing wiring having a relatively low wire resistance.

It is also an object of the present invention to provide a method of fabricating a semiconductor memory as mentioned above.

In one aspect, the invention provides a semiconductor memory including (a) an address decoder, (b) a first word line in electrical connection with an output terminal of the address decoder, (c) a plurality of second, word lines, (d) a plurality of memory cells in electrical connection in parallel with each of the second word lines, and (e) a plurality of contacts each of which electrically connects each of the second word line to the first word line.

In another aspect, the invention provides a method of fabricating a semiconductor memory, including the steps of (a) forming a plurality of memory cells, (b) dividing the plurality of memory cells into a plurality of groups, (c) forming a plurality of second word lines so that each of the second word lines is in electrical connection in parallel with memory cells belonging to one of the groups, (d) forming a plurality of contacts each of which is in electrical connection with each of the second word lines, and (e) forming a first word line so that the first word line is in electrical connection with all of the second word lines and further with an output terminal of an address decoder.

Each of the second word lines preferably has a compensation for signal delay among the memory cells. For instance, the compensation may be constituted of a plurality of resistors each disposed between adjacent memory cells. A resistor disposed between each of the contacts and a memory cell A disposed closest to the contact may have a maximum resistance among the plurality of resistors, while a resistor disposed between a memory cell B disposed remotest from the contact and a memory cell adjacent to the memory cell B may have a minimum resistance among the plurality of resistors. A resistor disposed closer to the memory cell A may have a greater resistance than that of a resistor disposed remoter from the memory cell A.

A resistance of each of the plurality of resistors is preferably determined by a length between adjacent memory cells or a length between a contact and a memory cell disposed closest to the contact. The maximum and minimum resistances are determined within an allowable range defined by a time constant defined by total resistance of the resistors in one of the second word lines, a resistance of the contact which is in electrical connection with the one of the second lines, and parasitic capacitance in the one of the second lines.

The number of memory cells in connection with each of the second word lines may be the same as or different from one another.

In the semiconductor memory in accordance with the present invention, a group of memory cells are connected to a second word line, and in addition a word line serving as a backing wiring composed of, for instance, polysilicon is arranged above the second word line. The word line or backing wiring is in electrical connection with an output terminal of a column decoder, and further with the word line through the contact. Thus, the second word line is provided for every contact. Thus, since it is impossible for a memory cell in connection with the word line or backing wiring through a defective contact to carry out writing data therein and reading data therefrom, a semiconductor memory including such a memory cell therein can be readily, electrically found for removal at room temperature. Thus, the invention enhances the reliability of a semiconductor memory.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 3:
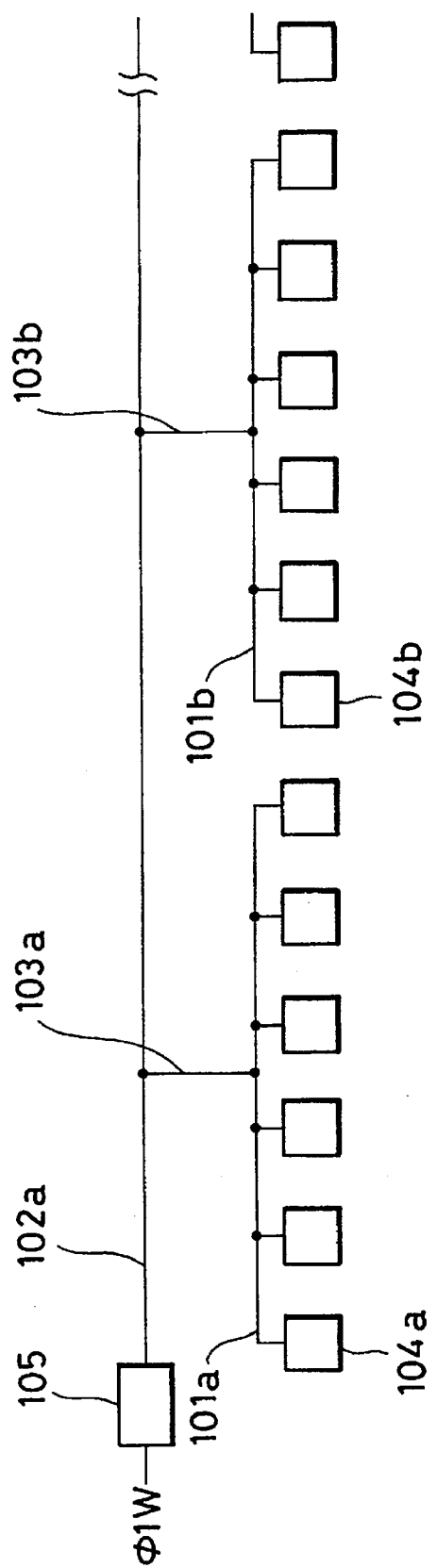
FIG. 3 is a schematic view of a circuit for driving a word line in accordance with the first embodiment of the present invention.

With reference to FIG. 3, in a circuit for driving a word line, a plurality of memory cells including a memory cell 104a are in electrical connection with a word line 101a composed of an aluminum wiring layer, and a plurality of memory cells including a memory cell 104b are in electrical connection with a word line 101b composed of an aluminum wiring layer. Similarly, a plurality of memory cells including a memory cell 104n are in electrical connection with a word line 101n, however, only the word lines 104a and 104b are illustrated. Above the word lines 101a and 101b are formed a group of backing wirings composed of polysilicon. Each of the backing wirings is electrically connected to each of output terminals of column decoders. As illustrated in FIG. 3, one of the backing wirings 102a is in electrical connection with an output terminal of one of the column decoders 105. The backing wiring 102a is further in electrical connection with the word line 101a through a contact 103a, and further with the word line 101b through a contact 103b.

Figure 1A:
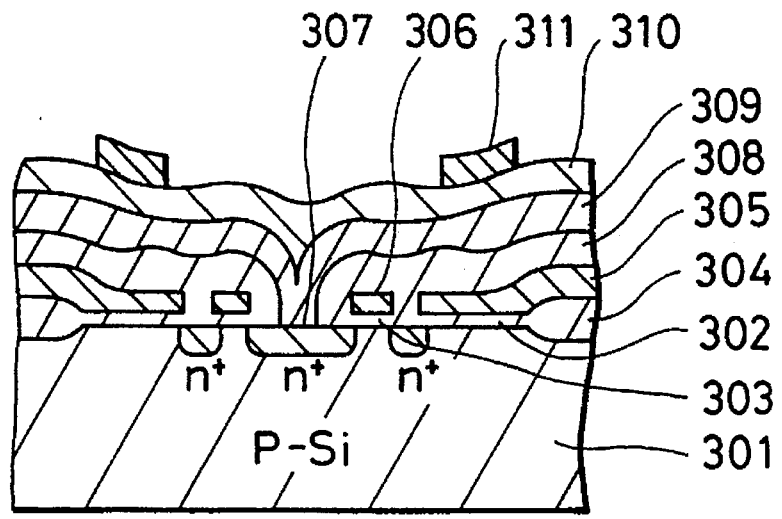
FIG. 1A is a cross-sectional view illustrating a positional relationship among a memory cell transistor, a word line and a backing wiring in a conventional semiconductor memory.
Figure 1B:
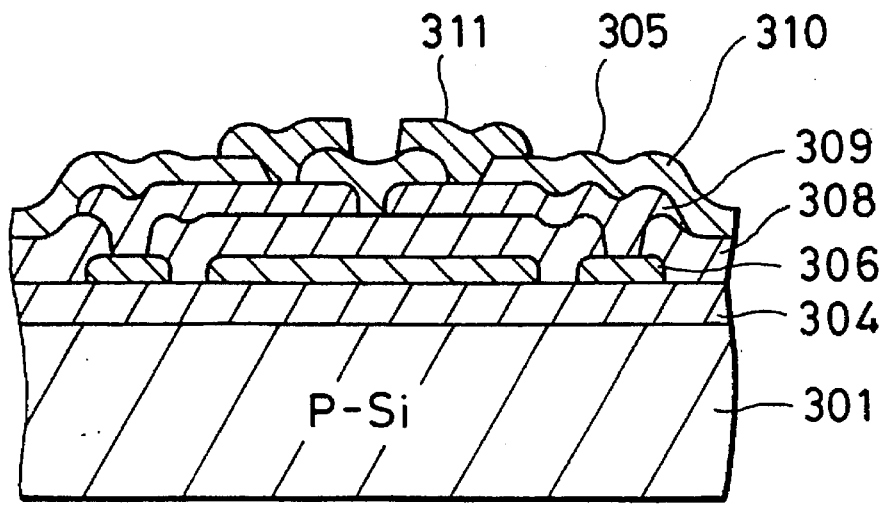
FIG. 1B is a cross-sectional view illustrating a word line and a backing wiring which are connected with each other through a first aluminum wiring.
Figure 2:
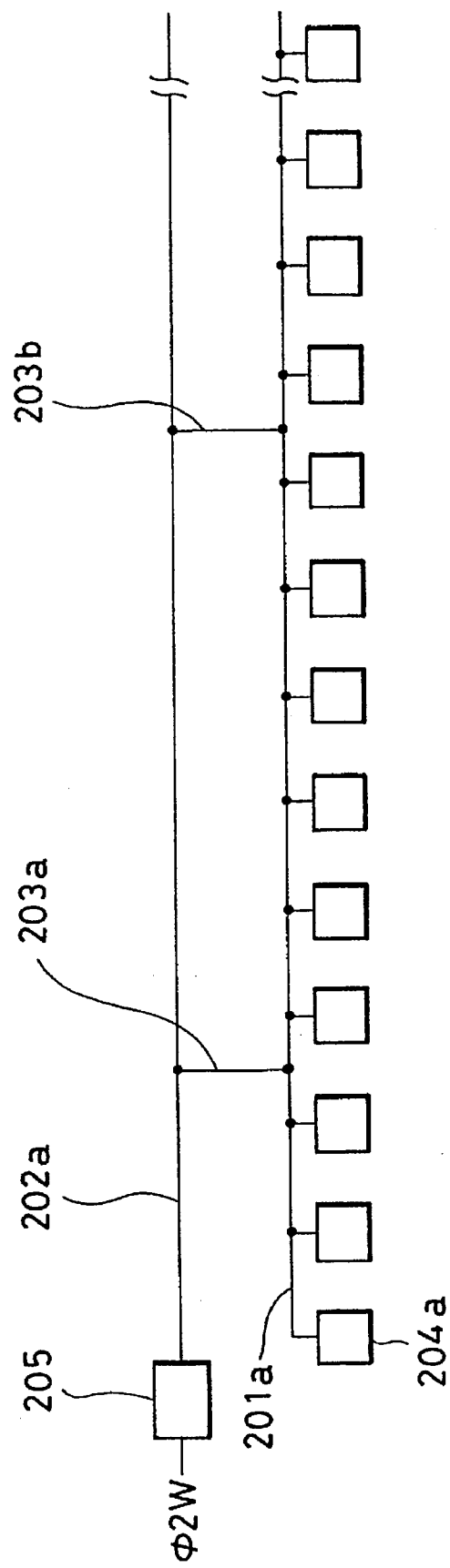
FIG. 2 is a schematic view of a circuit for driving a word line in a conventional semiconductor memory.

The major differences between the illustrated semiconductor memory and a conventional semiconductor memory illustrated in FIG. 2 are that a single word line composed of aluminum is divided into a plurality of individual word lines, that a plurality of memory cells are divided into a plurality of groups each of which is to be in electrical connection with one of the divided word lines, and that each of the divided word lines has a contact connected thereto. Except the foregoing differences, the semiconductor memory in accordance with the first embodiment illustrated in FIG. 3 has the same structure as that of the conventional semiconductor memory illustrated in FIG. 2.

Referring back to FIG. 3 again, when data stored in the memory cell 104a is to be read out, a word line drive signal φ1w is activated and then transmitted to the relatively low resistive backing wiring 102a selected by the decoder 105. Then, the word line drive signal φ1w is transmitted to the relatively high resistive word lines 101a, 101b and other word lines (not illustrated) through the contacts 103a, 103b and other contacts (not illustrated), thereby transistor gates of the memory cells 104a, 104b and other memory cells being activated. Then, for instance, the memory cell 104a is selected by a row decoder (not illustrated), and data stored in the memory cell 104a is output onto a bit line. The output data is amplified by a sense amplifier.

If the contact 103a becomes defective, the word line drive signal φ1w is not transmitted from the decoder 105 to the memory cell 104a. Hence, even if the memory cell 104a is selected by the row decoder, data stored in the memory cell 104a is not output onto a bit line.

Accordingly, defective memories are removed in electrical property test to be carried out at room temperature to a wafer after a diffusion step has been completed. Thus, it is no longer necessary to carry out low temperature test which was indispensable for a conventional memory in which the certain number of contacts are connected to a single continuously extending word line at desired points.

Thus, it is possible to obtain at early stages information about defectiveness causes such as fine dust to be generated in a diffusion step. In addition, such information can be obtained not for a chip, but for a wafer. The wafer information about the test results enhance the rate of a diffusion step. It is possible to carry out the electrical property test even after a packaging step has been completed.

Figure 4:
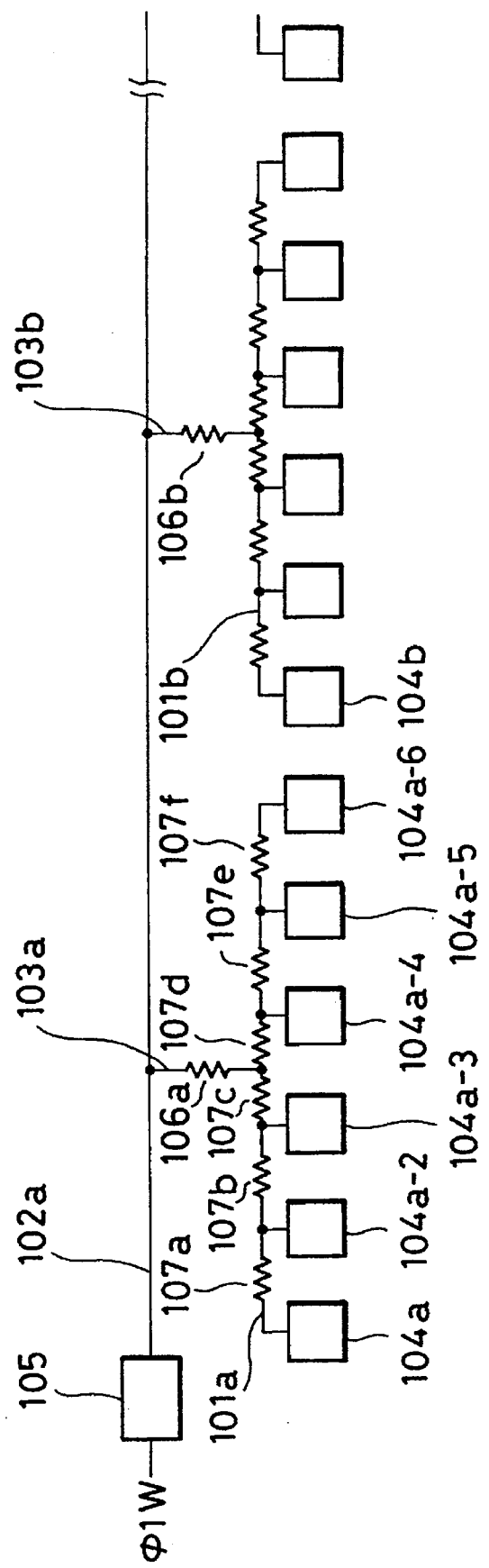
FIG. 4 is a schematic view of a circuit for driving a word line in accordance with the second embodiment of the present invention.

FIG. 4 illustrates a semiconductor memory in accordance with the second embodiment of the present invention. The second embodiment aims overcoming the delay of activation of a word line drive signal, and standardizes a signal speed, at which the word line drive signal runs after the word line is selected until the signal is transmitted into a sense amplifier of a bit line, to be common in a whole memory cell. The signal speed is determined to be an optimal speed in designing a semiconductor memory, taking into consideration parasitic capacitance and wire resistance of polysilicon word lines including the word line 101a.

The semiconductor memory in accordance with the second embodiment is different from the first embodiment in that the semiconductor memory of the second embodiment has resistive elements 106a and 106b in the contacts 103a and 103b, and means for compensating for the signal delay among the memory cells in each of the word lines 101a, 101b,–, 101n. The compensating means comprises resistive elements 107a, 107b, 107c, 107d, 107e and 107f. The resistive elements 107c and 107d are disposed between the resistive element 106a of the contact 103a and the memory cells situated closest to the contact 103a, respectively. The other resistive elements 107a, 107b, 107e and 107f are disposed between adjacent memory cells.

Taking into consideration a transmission speed of a signal to be transmitted to a memory cell disposed remotest from the resistive element 106a of the contact 103a, the resistive element 107d disposed between the contact 103a and a memory cell 104a-4 disposed closest to the contact 103a is arranged to have a maximum resistance among the resistive elements 107d, 107e and 107f. On the other hand, the resistive element 107f disposed between a memory cell 104a-6 disposed remotest from the contact 103a and a memory cell 104a-5 adjacent to the memory cell 104a-6 is arranged to have a minimum resistance among the resistive elements 107d, 107e and 107f. The resistive element 107e disposed between the memory cells 104a-4 and 104a-5 is arranged to have a resistance greater than the minimum resistance of the resistive element 107f, but smaller than the maximum resistance of the resistive element 107d.

Similarly, the resistive element 107c disposed between the contact 103a and a memory cell 104a-3 disposed closest to the contact 103a is arranged to have a maximum resistance among the resistive elements 107a, 107b and 107c. The resistive element 107a disposed between the memory cell 104a disposed remotest from the contact 103a and a memory cell 104a-2 adjacent to the memory cell 104a is arranged to have a minimum resistance among the resistive elements 107a, 107b and 107c. The resistive element 107b disposed between the memory cells 104a-2 and 104a-3 is arranged to have a resistance greater than the minimum resistance of the resistive element 107a, but smaller than the maximum resistance of the resistive element 107c. Namely, a resistive element disposed closer to the contact 103a has a greater resistance than that of a resistive element disposed remoter from the contact 103a.

The resistive elements 107a, 107b and 107c are arranged to have the same resistances as those of the resistive elements 107f, 107e and 107d, respectively. As an alternative, the resistive elements 107a, 107b and 107c may be arranged to have different resistances from those of the resistive elements 107f, 107e and 107d, respectively, unless the resistive elements 107c and 107d have the maximum resistance and the resistive elements 107a and 107f have the minimum resistance.

In the illustrated semiconductor memory, each of the resistances of the resistive elements 107a to 107f are determined in accordance with a length between adjacent memory cells or between a contact and a memory cell disposed closest to the contact. Hence, a length between the contact 103a and the memory cell 104a-4 is longer than both a length between the memory cells 104a-4 and 104a-5 and a length between the memory cells 104a-5 and 104a-6, and a length between the memory cells 104a-4 and 104a-5 is longer than a length between the memory cells 104a-5 and 104a-6. Similarly, a length between the contact 103a and the memory cell 104a-3 is longer than both a length between the memory cells 104a-2 and 104a-3 and a length between the memory cells 104a and 104a-2, and a length between the memory cells 104a-2 and 104a-3 is longer than a length between the memory cells 104a and 104a-2.

A length between the memory cells 104a-5 and 104a-6, a length between the memory cells 104a-4 and 104a-5, and a length between the contact 103a and the memory cell 104a-4 are equal to a length between the memory cells 104a and 104a-2, a length between the memory cells 104a-2 and 104a-3, and a length between the memory cell 104a-3 and the contact 103a, respectively. However, it should be noted that they may be arranged to be different from each other, respectively.

Each of the maximum resistances of the resistive elements 107c and 107d are determined within an allowable range defined by a time constant defined by total resistance of the resistive elements 107a to 107f, a resistance of the contact 103a, and parasitic capacitance in the word line 101a.

Though having been described in connection to the contact 103a and the associated word line 101a and memory cells 104a to 104a-6, the other contacts, word line and memory cells are configured in the same manner.

In the second embodiment illustrated in FIG. 4, each of the word lines 101a, 101b,–, 101n has the same number of memory cells connected thereto. However, it should be noted that the word lines may have the different number of memory cells connected thereto from one another.

In addition, though the same number of memory cells are disposed at the opposite ends of each of the contacts in the illustrated embodiments, the different number of memory cells may be disposed at the opposite ends of each of the contacts.

Though the two embodiments having been described relate to a word line drive circuit, the embodiments can be applied to a circuit in which a bit line or a input/output bus line is composed of a plurality of different conductors. In accordance with the embodiments, a rate at which a contact becomes defective is in the range of hundreds of ppm to tens of ppm, calculating in terms of a defectiveness rate of a packaged semiconductor memory. This figure is sufficiently small. A specific step such as electrical property test to be carried out at low temperature had been conventionally required in order to remove a semiconductor memory having contact defectiveness, and such a specific step has increased the cost for fabricating a semiconductor memory. The invention overcomes such a cost problem, too.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor memory comprising:

an address decoder;

a first word line in electrical connection with an output terminal of said address decoder;

a plurality of second word lines;

a plurality of memory cells in electrical connection in parallel with each of said second word lines; and a plurality of contacts each of which electrically connects each of said second word line to said first word line.

2. A semiconductor memory comprising:

an address decoder;

a first word line in electrical connection with an output terminal of said address decoder;

a plurality of second word lines;

a plurality of memory cells in electrical connection in parallel with each of said second word lines;

a plurality of contacts each of which electrically connects each of said second word line to said first word line; and means for compensating for signal delay among said memory cells in each of said second word lines.

3. The semiconductor memory as set forth in claim 2, wherein said means comprising a plurality of resistors each disposed between adjacent memory cells.

4. The semiconductor memory as set forth in claim 3, wherein a resistor disposed between each of said contacts and a memory cell A disposed closest to said contact has a maximum resistance among said plurality of resistors, while a resistor disposed between a memory cell B disposed remotest from said contact and a memory cell adjacent to said memory cell B has a minimum resistance among said plurality of resistors.

5. The semiconductor memory as set forth in claim 4, wherein a resistor disposed closer to said memory cell A has a greater resistance than that of a resistor disposed remoter from said memory cell A.

6. The semiconductor memory as set forth in claim 3, wherein a resistance of each of said plurality of resistors is determined by a length between adjacent memory cells or a length between a contact and a memory cell disposed closest to said contact.

7. The semiconductor memory as set forth in claim 4, said maximum and minimum resistances are determined within an allowable range defined by a time constant defined by total resistance of said resistors in one of said second word lines, a resistance of said contact which is in electrical connection with said one of said second lines, and parasitic capacitance in said one of said second lines.

8. The semiconductor memory as set forth in claim 1, wherein each of said second word lines includes the same number of memory cells therein.

9. The semiconductor memory cell as set forth in claim 1, wherein each of said second word lines includes the different number of memory cells therein.

10. The semiconductor memory as set forth in claim 2, wherein each of said second word lines includes the same number of memory cells therein.

11. The semiconductor memory cell as set forth in claim 2, wherein each of said second word lines includes the different number of memory cells therein.

12. A semiconductor memory comprising:

an address decoder;

a first word line associated with one row of memory cells and in electrical connection with one output terminal of said address decoder;

a plurality of second word lines associated with said one row of memory cells;

a plurality of memory cells of said row of memory cells, in electrical connection in parallel with each of said second word lines; and a plurality of contacts, one of each of said plurality of contacts electrically connecting one of each of said plurality of second word lines to said first word line.

13. A semiconductor memory comprising:

a first conductive line for electrically conveying a predetermined signal to a memory cell array;

a plurality of second conductive lines for electrically conveying said predetermined signal to said memory cell array; and a plurality of contacts, one of each of said plurality of contacts electrically connecting one of each of said plurality of second conductive lines to said first conductive line, to more completely detect defects of any one of said plurality of contacts at room temperature.

14. The semiconductor memory as set forth in claim 13, further comprising a means for compensating for signal delay in each of said second conductive lines.

15. The semiconductor memory as set forth in claim 14, wherein said means for compensating for signal delay comprises a plurality of resistors.

16. The semiconductor memory as set forth in claim 15, wherein a resistance of each of said plurality of resistors is determined by a length of said second conductive lines between two circuit components or a length between a contact and one of said circuit components closest to said contact.

17. The semiconductor memory as set forth in claim 15, wherein a maximum and a minimum resistance of said plurality of resistors are determined within an allowable range defined by a time constant defined by total resistance of said resistors in one of said second conductive lines, a resistance of said contact which is in electrical connection with said one of said second conductive lines, and parasitic capacitance in said one of said second conductive lines.

* * * * *